(12) United States Patent
Igarashi

(10) Patent No.: US 11,489,084 B2
(45) Date of Patent: Nov. 1, 2022

(54) PHOTODETECTION ELEMENT

(71) Applicant: NEC Corporation, Tokyo (JP)

(72) Inventor: Yuichi Igarashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 54 days.

(21) Appl. No.: 17/053,604

(22) PCT Filed: May 11, 2018

(86) PCT No.: PCT/JP2018/018234
§ 371 (c)(1),
(2) Date: Nov. 6, 2020

(87) PCT Pub. No.: WO2019/215902
PCT Pub. Date: Nov. 14, 2019

(65) Prior Publication Data
US 2021/0242361 A1    Aug. 5, 2021

(51) Int. Cl.
*H01L 31/103* (2006.01)
*H01L 31/0352* (2006.01)

(52) U.S. Cl.
CPC .. *H01L 31/1035* (2013.01); *H01L 31/035236* (2013.01); *H01L 31/035272* (2013.01)

(58) Field of Classification Search
CPC ......... H01L 31/1035; H01L 31/035236; H01L 31/035272; H01L 31/03046; H01L 31/035281; H01L 31/101; H01L 31/105
See application file for complete search history.

(56) References Cited

U.S. PATENT DOCUMENTS

| | | |
|---|---|---|
| 5,442,649 A | 8/1995 | Kokubo et al. |
| 2007/0131923 A1 | 6/2007 | Uchiyama et al. |
| 2010/0072514 A1 | 3/2010 | Ting et al. |
| 2012/0145996 A1* | 6/2012 | Ting .................... H01L 31/1852 257/E29.022 |
| 2014/0184806 A1* | 7/2014 | Tidhar ..................... G01J 1/42 348/164 |
| 2014/0312303 A1* | 10/2014 | Klipstein ........ H01L 31/035236 257/184 |
| 2014/0312304 A1 | 10/2014 | Miura et al. |
| 2015/0155420 A1* | 6/2015 | Webster .......... H01L 31/035236 257/18 |

(Continued)

FOREIGN PATENT DOCUMENTS

| | | |
|---|---|---|
| JP | H07-86678 A | 3/1995 |
| JP | 2006-186183 A | 7/2006 |

(Continued)

OTHER PUBLICATIONS

International Search Report for PCT Application No. PCT/JP2018/018234, dated Jun. 5, 2018.

(Continued)

*Primary Examiner* — Sitaramarao S Yechuri
(74) *Attorney, Agent, or Firm* — Sughrue Mion, PLLC

(57) ABSTRACT

A photodetection element that includes: a substrate with a high infrared transmittance in a desired wavelength region; an electron barrier layer of a type-I superlattice structure, the electron barrier layer being formed above the substrate and lattice-matched to the substrate; and a light-receiving layer of a type-II superlattice structure, formed in contact with the electron barrier layer.

17 Claims, 10 Drawing Sheets

(56) References Cited

U.S. PATENT DOCUMENTS

| | | | | |
|---|---|---|---|---|
| 2015/0162471 | A1* | 6/2015 | Cohen | H01L 27/14683 438/94 |
| 2016/0307956 | A1 | 10/2016 | Klipstein et al. | |
| 2020/0279959 | A1* | 9/2020 | Iida | C25B 1/04 |

FOREIGN PATENT DOCUMENTS

| | | | |
|---|---|---|---|
| JP | 2007-184512 | A | 7/2007 |
| JP | 2012-146806 | A | 8/2012 |
| JP | 2013-251341 | A | 12/2013 |
| JP | 2015-141969 | A | 8/2015 |
| JP | 5975417 | B2 | 8/2016 |

OTHER PUBLICATIONS

English translation of Written opinion for PCT Application No. PCT/JP2018/018234, dated Jun. 5, 2018.

J. B. Rodriguez, E. Plis, G. Bishop, Y. D. Sharma, H. Kim, L. R. Dawson, S. Krishna, "nBn structure based on InAs/GaSb type-II strained layer superlattices", Applied Physics Letters, vol. 91, 043514, 2007, USA.

A. Haddadi, R. Chevallier, A. Dehzangi, M. Razeghi, "Extended short-wavelength infrared nBn photodetectors based on type-II InAs/AlSb/GaSb superlattices with an AlAsSb/GaSb superlattice barrier", Applied Physics Letters, vol. 110, 101104, 2017, USA.

H. S. Kim et al., "Mid-IR focal plane array based on type-II InAs/GaSb strain layer superlattice detector with nBn design", Applied Physics Letters, vol. 92, 183502, 2008, USA.

N. Gautam et al., "Performance improvement of longwave infrared photodetector based on type-II InAs/GaSb superlattices using unipolar current blocking layers", Applied Physics Letters, vol. 96, 231107, 2010, USA.

Japanese Office Action for JP Application No. 2020-517726 dated Mar. 8, 2022 with English Translation.

Kohei Miura etal., Mid-infrared Sensors with InAs/GaSb Superlattice Absorption Layers Grown on InP Substrates, SEI Technical Review, Sumitomo Electric Mfg, 2014, Jan. 2014, No. 184, pp. 55-60, Japan.

* cited by examiner

US 11,489,084 B2

PHOTODETECTION ELEMENT

This application is a National Stage Entry of PCT/JP2018/018234 filed on May 11, 2018, the contents of all of which are incorporated herein by reference, in their entirety.

TECHNICAL FIELD

The present invention relates to a photodetection element that detects infrared rays.

BACKGROUND ART

Bulk semiconductors such as mercury cadmium telluride (HgCdTe) and indium gallium arsenide (InGaAs) are widely used as light-receiving materials for photodetection elements that detect infrared rays. A photodetection element has also been disclosed, which includes a light-receiving layer of a type-II superlattice structure in which indium arsenide (InAs) layers and gallium antimonide (GaSb) layers are alternately stacked in short cycles, instead of bulk semiconductors.

The type-II superlattice structure is a structure in which a plurality of semiconductor compositions with wide band gap are combined to achieve an effective narrow band gap between minibands of electron and hole. The InAs/GaSb superlattice has larger effective carrier mass than a bulk semiconductor such as HgCdTe, and can reduce the Auger recombination rate.

In the type-II superlattice structure, electrons and holes are generated as infrared rays are incident on the light-receiving layer. In order to take out a photocarrier (signal) before electrons and holes are recombined, a bias voltage of about several hundred millivolts is applied between two electrodes sandwiching the light-receiving layer, so that the electrons and holes are each conducted to the opposite electrode. When the bias voltage is applied between the two electrodes sandwiching the light-receiving layer, drift current flows from a negative-side contact layer, which is positively biased with respect to electrons, to a positive-side contact layer via the light-receiving layer. Since the negative-side n-type contact layer is densely doped with n-type impurities, diffusion current is caused by a difference in electron density between the light-receiving layer and the contact layer. The drift current and the diffusion current (also referred to as dark current) flow with no relation to the photocarriers, and thus may cause noise.

NPL 1 discloses a photodetection element of an nBn structure in which an electron barrier layer of a bulk semiconductor is provided between a light-receiving layer of a type-II superlattice structure and an n-type contact layer. The photodetection element of NPL 1 includes the light-receiving layer of the type-II superlattice structure in which InAs layers and GaSb layers are alternately stacked. The photodetection element of NPL 1 includes a bulk aluminum gallium antimonide (($Al_{0.4}$GaSb) layer as an electron barrier layer. According to the photodetection element disclosed in NPL 1, it is possible to reduce dark current by introducing an electron barrier layer serving as a potential wall for electrons between the negative-side n-type contact layer and the light-receiving layer.

NPL 2 discloses a photodetection element in which an electron barrier layer of a type-I superlattice structure and a light-receiving layer of a type-II superlattice structure are stacked on a GaSb substrate. The photodetection element of NPL 2 includes the light-receiving layer of the type-II superlattice structure in which InAs layers, aluminum antimonide (AlSb) layers, and GaSb layers are stacked one after another in sequence. The photodetection element of NPL 2 also includes the electron barrier layer of the type-I superlattice structure in which aluminum arsenide antimonide ($AlAs_{0.1}Sb$) layers and GaSb layers are alternately stacked.

In the case of constructing an infrared sensor array by using the photodetection element of NPL 1 or NPL 2, a readout circuit formed on a silicon substrate and the photodetection element formed on a GaSb substrate are flip-chip bonded through a semiconductor microfabrication process. In the photodetection element thus configured, in which infrared rays are incident on the back surface of the GaSb substrate, sufficient sensitivity cannot be achieved depending on the thickness of the GaSb substrate because the infrared transmittance of the GaSb substrate is low. For this reason, in the case of constructing an infrared detector by using the photodetection element of NPL 1 or NPL 2, it is desirable to process the GaSb substrate in such a way as to reduce the thickness of the GaSb substrate as far as possible. However, there has been a possibility that sufficient strength cannot be obtained if the GaSb substrate is made too thin.

PTL 1 discloses a light-receiving element using an indium phosphide (InP) substrate. The InP substrate has a low infrared absorptance in a wavelength region of 3 to 12 micrometers. Therefore, if the photodetection element of NPL 1 or NPL 2 can be formed on the InP substrate, it is possible to achieve both the sensitivity of the photodetection element and the strength of the substrate.

CITATION LIST

Patent Literature

[PTL 1] JP 5975417 B2
[PTL 2] JP 2007-184512 A
[PTL 3] JP 2006-186183 A
[PTL 4] JP 07-086678 A

Non Patent Literature

[NPL 1] J. B. Rodriguez, E. Plis, G. Bishop, Y. D. Sharma, H. Kim, L. R. Dawson, S. Krishna, "nBn structure based on InAs/GaSb type-II strained layer superlattices", Applied Physics Letters, vol. 91, 043514, 2007
[NPL 2] A. Haddadi, R. Chevallier, A. Dehzangi, M. Razeghi, "Extended short-wavelength infrared nBn photodetectors based on type-II InAs/AlSb/GaSb superlattices with an AlAsSb/GaSb superlattice barrier", Applied Physics Letters, vol. 110, 101104, 2017

SUMMARY OF INVENTION

Technical Problem

When the electron barrier layer of the type-I superlattice structure is used as in NPL 2, it is possible to cause the hole miniband of the electron barrier layer to substantially match the hole miniband of the light-receiving layer, by adjusting the thickness of the GaSb layer included in the type-I superlattice. If it is possible to cause the hole miniband of the electron barrier layer to substantially match the hole miniband of the light-receiving layer, conduction of holes generated in the light-receiving layer is not prevented, so that operation bias can be reduced. However, since the GaSb substrate with a low infrared transmittance in a short wavelength region is used in the photodetector of NPL 2, it is necessary to thin the GaSb substrate so as to improve the infrared transmittance, so that there is a trade-off between the infrared transmittance and the strength of the substrate.

Since an InP substrate with a high infrared transmittance in a short wavelength region is used in the light-receiving element of PTL 1, the trade-off between the infrared transmittance and the strength of the substrate can be eliminated. Therefore, if the photodetection element including the electron barrier layer of the type-I superlattice structure of NPL 2 can be formed on the InP substrate of PTL 1, it is possible to achieve both the strength of the substrate and sensitivity.

However, InP has a lattice constant of 5.8686 angstroms, and $AlAs_{0.10}Sb$ lattice-matched to a GaSb substrate and a GaSb layer has a lattice constant of 6.0959 angstroms, so that there is a lattice constant difference equal to or more than 3%. That is, the electron barrier layer of the type-I superlattice structure ($AlAs_{0.10}Sb$/GaSb) of NPL 2 is not lattice-matched to the light-receiving layer of the type-II superlattice structure grown on the InP substrate of PTL 1 in such a way as to be lattice-matched to the InP substrate. Therefore, when the electron barrier layer of the type-I superlattice structure of NPL 2 is applied to the InP substrate of PTL 1, there has been a problem that there occurs dislocations in the electron barrier layer and the light-receiving layer and dark current is caused by the dislocations.

An object of the present invention is to solve the above-described problem and provide a photodetection element that has a high sensitivity to infrared rays in a desired wavelength region and achieves a reduction in dark current.

Solution to Problem

A photodetection element according to an aspect of the present invention includes: a substrate with a high infrared transmittance in a desired wavelength region; an electron barrier layer of a type-I superlattice structure, the electron barrier layer being formed above the substrate and lattice-matched to the substrate; and a light-receiving layer of a type-II superlattice structure, formed in contact with the electron barrier layer.

Advantageous Effects of Invention

According to the present invention, it is possible to provide a photodetection element that has a high sensitivity to infrared rays in a desired wavelength region and achieves a reduction in dark current.

EXAMPLE EMBODIMENT

Figure 1:
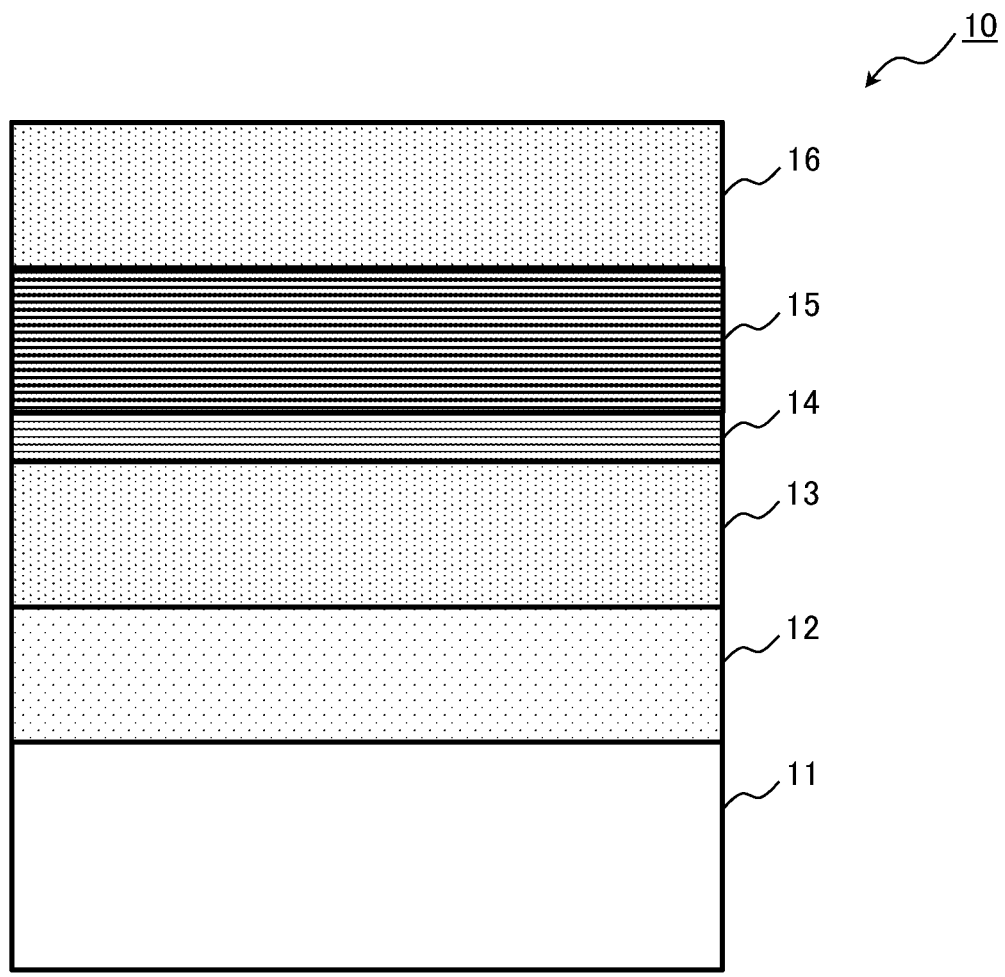
FIG. 1 is a conceptual diagram illustrating an example of the structure of a photodetection element according to a first example embodiment of the present invention.

Example embodiments of the present invention will be described below with reference to the drawings. However, while technically preferred limitations for carrying out the present invention have been placed on the example embodiments to be described below, the scope of the invention is not limited to the following. In all the drawings to be used for describing the example embodiments below, the same reference numerals are given to the same constituent elements except in special circumstances. In the following example embodiments, repeated description of the same configuration and operation may be omitted.

First Example Embodiment

First, a photodetector according to a first example embodiment of the present invention will be described with reference to the drawings. The photodetection element according to the present example embodiment includes a structure in which an electron barrier layer of a type-I superlattice structure and a light-receiving layer of a type-II superlattice structure are stacked on a substrate with a high infrared transmittance in a desired wavelength region. An example of using an indium phosphide (InP) substrate with a high infrared transmittance in a short wavelength region (1.4 to 3.0 micrometers) will be described in the present example embodiment.

FIG. 1 is a schematic diagram illustrating an example of the configuration of a photodetection element 10 according to the present example embodiment. As illustrated in FIG. 1, the photodetection element 10 includes a substrate 11, a buffer layer 12, a first contact layer 13, an electron barrier layer 14, a light-receiving layer 15, and a second contact layer 16. The photodetection element 10 has a structure (nin type) in which the electron barrier layer 14 and the light-receiving layer 15 are sandwiched between the first contact layer 13 of n-type and the second contact layer 16 of n-type. FIG. 1 conceptually illustrates the configuration of the photodetection element 10, and does not precisely represent measurements of each layer.

The substrate 11 is a substrate with a high transmittance of desired infrared rays. An example of using an InP substrate as the substrate 11 will be described below. Indium phosphide (InP) has a lower infrared absorptance in a wide wavelength region than gallium antimonide (GaSb). Undoped InP has a lattice constant of 5.8686 angstroms. The substrate 11 may be undoped, or may be doped.

The buffer layer 12 is formed on the upper surface of the substrate 11. The buffer layer 12 is a layer grown by crystal growth in accordance with the plane orientation of the upper surface of the substrate 11. The buffer layer 12 is made of the same material as the substrate 11. In the present example embodiment, InP is also used for the buffer layer 12 as with the substrate 11.

The first contact layer 13 is formed on the upper surface of the buffer layer 12. The first contact layer 13 contains an n-type dopant. For example, silicon (Si) can be used as the n-type dopant for the first contact layer 13. The first contact layer 13 may be identical in composition (InP) to the buffer layer 12, or may contain another semiconductor material lattice-matched to InP. For example, InGaAs lattice-matched to InP can be used as the first contact layer 13.

The electron barrier layer 14 is placed on the upper surface of the first contact layer 13. The electron barrier layer 14 has a type-I superlattice structure. The type-I superlattice structure included in the electron barrier layer 14 is a structure in which at least two types of layers (first barrier layers and second barrier layers) are alternately stacked in short cycles. Hereinafter, the electron barrier layer 14 of the type-I superlattice structure in which the first barrier layers and the second barrier layers are alternately stacked will be described as an example. The electron barrier layer 14 may be formed by combining three or more types of layers.

The type-I superlattice structure is a structure in which a layer (second barrier layer) made of a narrow-band gap material is sandwiched between layers (first barrier layers) made of a wide-band gap material. In the type-I superlattice structure, electrons and holes are confined in spatially the same places.

Described below as an example is the electron barrier layer 14 including an aluminum arsenide antimonide (AlAs$_{0.55}$Sb) layer as the first barrier layer and a gallium arsenide antimonide (GaAs$_{0.55}$ Sb) layer as the second barrier layer. Hereinafter, the type-I superlattice structure in which the AlAs$_{0.55}$ Sb layers and the GaAs$_{0.55}$ Sb layers are alternately stacked is referred to as AlAsSb/GaAsSb. For example, the electron barrier layer 14 may be formed by stacking several dozen AlAsSb/GaAsSb pairs. However, the number of layers stacked in the electron barrier layer 14 is not limited to the above.

The lattice constant of the type-I superlattice structure forming the electron barrier layer 14 is matched to the lattice constant of the material forming the substrate 11. For example, when the substrate 11 is made of InP, the lattice constant of the type-I superlattice structure forming the electron barrier layer 14 is matched to the lattice constant of InP (5.8686 angstroms).

According to the mechanical equilibrium theory of Matthews and Blakeslee, when the degree of lattice mismatch exceeds 1%, a critical film thickness is in the order of nanometers, so that the crystal quality of the superlattice cannot be maintained at a specific level. Therefore, it is desirable that the type-I superlattice structure forming the electron barrier layer 14 be lattice-matched to the material (InP) forming the substrate 11 on the condition (lattice matching condition) that a difference in lattice constant between the electron barrier layer 14 and InP is equal to or less than 1%. In other words, it is desirable that the degree of mismatch between lattice constants of the electron barrier layer 14 and the substrate 11 be less than 1%. The critical film thickness is a film thickness at which a misfit dislocation occurs at the hetero interface when the layers are further laminated. The lattice matching condition on which the type-I superlattice structure forming the electron barrier layer 14 is lattice-matched to the material (InP) forming the substrate 11 is more desirably equal to or less than 0.5%, and much more desirably equal to or less than 0.2%.

For example, the type-I superlattice structure forming the electron barrier layer 14 may contain another semiconductor material as long as the another semiconductor material is lattice-matched to the substrate 11 (InP). For example, the electron barrier layer 14 may contain phosphorus (P) contained in the substrate 11.

Assuming that the symbol "v" denotes an Al rate, the symbol "w" denotes an In rate, the symbol "x" denotes an As rate, and the symbol "y" denotes an Sb rate (0≤v, w, x, y≤1) in the first barrier layer (AlAsSb) of the electron barrier layer 14, the composition of the electron barrier layer 14 can be represented by formula 1 below.

$$Al_v In_w Ga_{1-v-w} As_x Sb_y P_{1-x-y} \quad (1)$$

The representation of formula 1 above includes AlAsSb.

Similarly, when the symbol "s" denotes an In rate, the symbol "t" denotes an As rate, and the symbol "u" denotes an Sb rate (0≤s, t, u≤1) in the second barrier layer (GaAsSb) of the electron barrier layer 14, the composition of the electron barrier layer 14 can be represented by formula 2 below.

$$In_s Ga_{1-s} As_t Sb_u P_{1-t-u} \quad (2)$$

The representation of formula 2 above includes GaAsSb. The representation of formula 2 above also includes InP, InGaAs, InAsP, InSbP, GaSbP, InGaP, InGaAsP, InGaSbP, InGaAsSb, InGaAsP, and InGaAsSbP.

The As rate in the second barrier layer (GaAsSb) of the electron barrier layer 14 may be any value as long as the condition for lattice matching to the substrate 11 (InP) is satisfied. Hereinafter, the As rate in the second barrier layer (GaAsSb) of the electron barrier layer 14 is set to the same value (0.55) as the As rate in a second light-receiving layer (GaAsSb) of the light-receiving layer 15.

Meanwhile, an optimum value of the As rate of the first barrier layer (AlAsSb) of the electron barrier layer 14 is nearly 0.56. This is because, as a result of linear interpolation of the lattice constant (5.6605 angstroms) of AlAs and the lattice constant (6.1355 angstroms) of AlSb, the lattice constant (5.8686 angstroms) of InP is obtained when the As rate is nearly 0.56. An example in which the As rate of the first barrier layer (AlAsSb) of the electron barrier layer 14 is set to 0.55 will be described below, but the As rate is not limited thereto as long as the condition for lattice matching to the InP substrate is satisfied. A difference in lattice constant between AlAs$_{0.55}$Sb and InP is estimated to be about 0.1%, and this satisfies the lattice matching condition (0.2% or less) that is the most desirable lattice matching condition of the above-described lattice matching conditions.

The light-receiving layer 15 is placed on the upper surface of the electron barrier layer 14. The light-receiving layer 15 has a type-II superlattice structure. The type-II superlattice structure included in the light-receiving layer 15 is a structure in which at least two types of layers (first light-receiving layers and second light-receiving layers) are alternately stacked in short cycles. Hereinafter, the light-receiving layer 15 of the type-II superlattice structure in which the first light-receiving layers and the second light-receiving layers are alternately stacked will be described as an example. The light receiving layer 15 may be formed by combining three or more types of layers.

In the type-II superlattice structure, an effectively narrow band gap is formed by use of an inter-miniband transition between the first light-receiving layer and the second light-receiving layer that are adjacent to each other. In the type-II superlattice structure, electrons and holes are confined in spatially different places. In other words, electrons and holes are alternately confined in different layers in the type-II superlattice structure.

Described below as an example is the light-receiving layer 15 including an indium gallium arsenide ($In_{0.52}GaAs$) layer as the first light-receiving layer and a $GaAs_{0.55}Sb$ layer as the second light-receiving layer. Hereinafter, the type-II superlattice structure in which the $In_{0.52}GaAs$ layers and the $GaAs_{0.55}Sb$ layers are alternately stacked is referred to as InGaAs/GaAsSb. For example, the light-receiving layer 15 may be formed by stacking several hundred InGaAs/GaAsSb pairs. However, the number of layers stacked in the light-receiving layer 15 is not limited to the above. For example, the light-receiving layer 15 of the type-II superlattice structure is grown on the substrate 11 by using metal organic chemical vapor deposition, molecular beam epitaxy, or a method equivalent to these methods.

In order to keep the crystal quality of the light-receiving layer 15 at a high level, it is desirable that the lattice constant of the type-II superlattice structure forming the light-receiving layer 15 be matched to the lattice constant of the material forming the substrate 11. For example, when the substrate 11 is made of InP, it is desirable that the lattice constant of the type-II superlattice structure forming the light-receiving layer 15 be matched to the lattice constant of InP (5.8686 angstroms). Therefore, it is desirable that the type-II superlattice structure forming the light-receiving layer 15 be lattice-matched to the material (InP) forming the substrate 11 on the condition (lattice matching condition) that a difference in lattice constant between the light-receiving layer 15 and InP is equal to or less than 1%. The lattice matching condition on which the type-II superlattice structure forming the light-receiving layer 15 is lattice-matched to the material (InP) forming the substrate 11 is more desirably equal to or less than 0.5%, and much more desirably equal to or less than 0.2%.

Another semiconductor material may be added to the light-receiving layer 15 as long as the condition for lattice matching to the material (InP) forming the substrate 11 is satisfied. For example, the light-receiving layer 15 may contain phosphorus (P) contained in the substrate 11. For example, assume that the symbol "a" denotes an In rate and the symbol "b" denotes an As rate in the first light-receiving layer ($In_{0.52}GaAs$) and the symbol "c" denotes an As rate and the symbol "d" denotes an Sb rate in the second light-receiving layer ($GaAs_{0.55}Sb$) of the light-receiving layer 15 (0≤a, b, c, d≤1). In this case, the composition of the light-receiving layer 15 can be represented by formula 3 below.

$$In_aGa_{1-a}As_bP_{1-b}/GaAs_cSb_dP_{1-c-d} \quad (3)$$

The representation of formula 3 above includes $In_{0.52}GaAs/GaAs_{0.55}Sb$.

The second contact layer 16 is placed on the upper surface of the light-receiving layer 15. The second contact layer 16 contains an n-type dopant. For example, Si may be used as the n-type dopant. The second contact layer 16 may be identical in composition (InP) to the buffer layer 12, or may contain another semiconductor material lattice-matched to InP. For example, InGaAs lattice-matched to InP can also be used as the second contact layer 16.

The configuration of the photodetection element 10 of the present example embodiment has been described above. The above-described configuration of the photodetection element 10 is an example, and the configuration of the photodetection element 10 according to the present example embodiment is not limited to the above-described configuration.

[Band Structure]

Next, the band structure of the light-receiving layer 15 included in the photodetection element 10 will be described with reference to the drawings.

Figure 2:
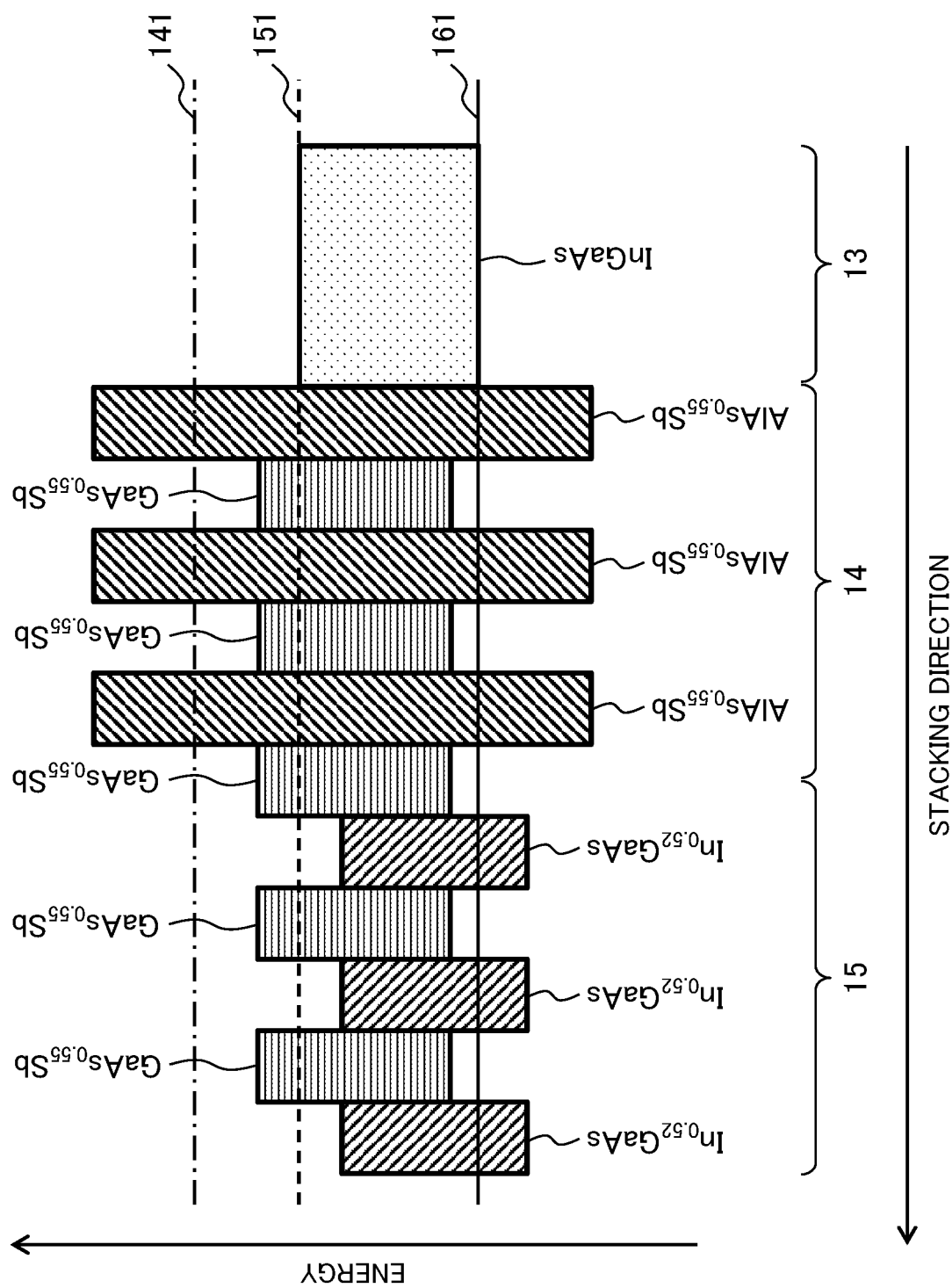
FIG. 2 is a conceptual diagram for describing band gaps of a light-receiving layer and an electron barrier layer included in the photodetection element according to the first example embodiment of the present invention.

FIG. 2 is a conceptual diagram for describing the band gap of the light-receiving layer 15 included in the photodetection element 10. In FIG. 2, the horizontal axis indicates the stacking direction, and the vertical axis indicates energy. FIG. 2 illustrates a structure in which the first contact layer 13, the electron barrier layer 14, and the light-receiving layer 15 are stacked from right to left in the drawing.

In FIG. 2, the band gap of each of layers forming the electron barrier layer 14 and the light-receiving layer 15 is indicated by a rectangle (hatched area). The upper side of the rectangle representing the band gap of each layer indicates the bottom of a conduction band, and the bottom side of the rectangle indicates the top of a valence band. FIG. 2 illustrates an electron miniband 141 (chain line) of the electron barrier layer 14, an electron miniband 151 (broken line) of the light-receiving layer 15, and a hole miniband 161 (solid line) of the electron barrier layer 14 and the light-receiving layer 15.

For convenience of description, FIG. 2 illustrates three layers for each of the electron barrier layer 14 (AlAsSb/GaAsSb) of the type-I superlattice structure and the light-receiving layer 15 (InGaAs/GaAsSb) of the type-II superlattice structure. In practice, for example, several dozen AlAsSb/GaAsSb pairs are stacked as the electron barrier layer 14, and several hundred InGaAs/GaAsSb pairs are stacked as the light-receiving layer 15. However, the numbers of layers stacked in the type-I superlattice structure forming the electron barrier layer 14 and the type-II superlattice structure forming the light-receiving layer 15 are not limited to the above.

Figure 3:
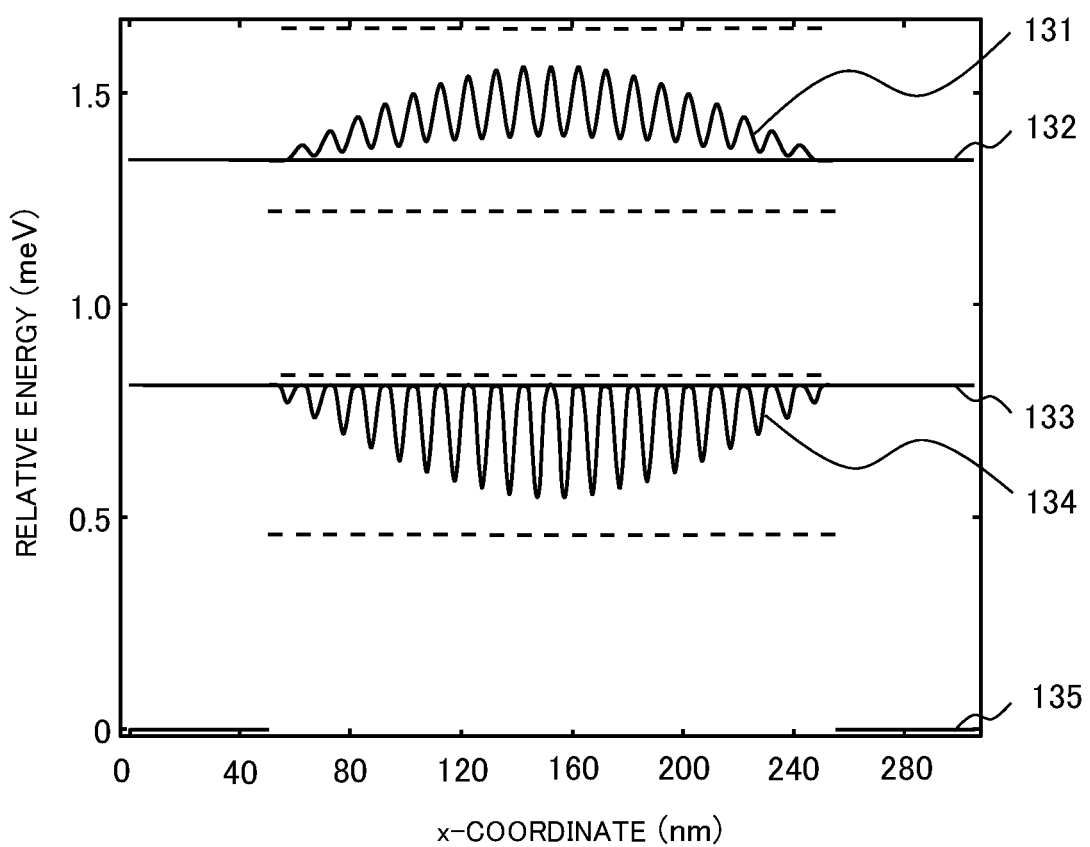
FIG. 3 is a diagram illustrating the result of numerical calculation of ground-state energy and wave functions of minibands in a superlattice structure included in the photodetection element according to the first example embodiment of the present invention.

FIG. 3 illustrates the result of numerical calculation of ground-state energy and wave functions of the hole miniband and electrons in the type-II superlattice structure in which 20 pairs of InGaAs and GaAsSb each having a thickness of 5 nm (nm: nanometer) are stacked. FIG. 3 illustrates a wave function 131 of the electron miniband, ground-state energy 132 of the electron miniband, ground-state energy 133 of the hole miniband, a wave function 134 of the hole miniband, and a bottom 135 of the valence band of InP. Broken lines in FIG. 3 indicate the bottoms of the conduction bands and valence bands of InGaAs and GaAsSb. As a result of numerical calculation, the ground-state energy of the hole miniband has been calculated at 813 meV (meV: millielectron volt) with the bottom of the valence band of InP set as the origin of energy.

Here, the thickness of the electron barrier layer 14 will be described. An AlAsSb/GaAsSb superlattice of the type-I superlattice structure has a larger valence band offset than an InGaAs/GaAsSb superlattice of the type-II superlattice structure. Thus, in the AlAsSb/GaAsSb superlattice of the type-I superlattice structure, quantum well confinement for holes is stronger than in the InGaAs/GaAsSb superlattice of the type-II superlattice structure. Therefore, when the AlAsSb/GaAsSb superlattice is formed with a pair of AlAsSb and GaAsSb each having the same thickness (for example, 5 nm) as the light-receiving layer 15, the ground-state energy of the hole miniband is smaller than that of the InGaAs/GaAsSb superlattice. That is, in the electron barrier layer 14, the energy difference between the ground-state energy of the hole miniband and the bottom of the valence band of the GaAsSb layer increases, and there is a discontinuity between the electron barrier layer 14 and the light-receiving layer 15 in terms of the energy of the hole miniband.

It is possible to make adjustment in such a way that the energy of the hole miniband of the electron barrier layer 14 matches that of the light-receiving layer 15 by changing the thickness of the second barrier layer (GaAsSb layer) of the electron barrier layer 14. For example, when the ground-state energy of the hole miniband is numerically calculated as in the case of the light-receiving layer 15 of FIG. 3, the ground-state energy of the hole miniband of the electron barrier layer 14 is 813 meV in the AlAsSb (5 nm)/GaAsSb (5.284 nm) superlattice. That is, when the electron barrier layer 14 is formed of AlAsSb (5 nm)/GaAsSb (5.284 nm), the energy of the hole miniband of the electron barrier layer 14 matches that of the light-receiving layer 15 formed of InGaAs (5 nm)/GaAsSb (5 nm).

That is, the thickness of the second barrier layer of the electron barrier layer 14 is desirably adjusted in such a way that the ground-state energy of the hole miniband of the electron barrier layer 14 matches that of the light-receiving layer 15.

Modified Example

Figure 4:
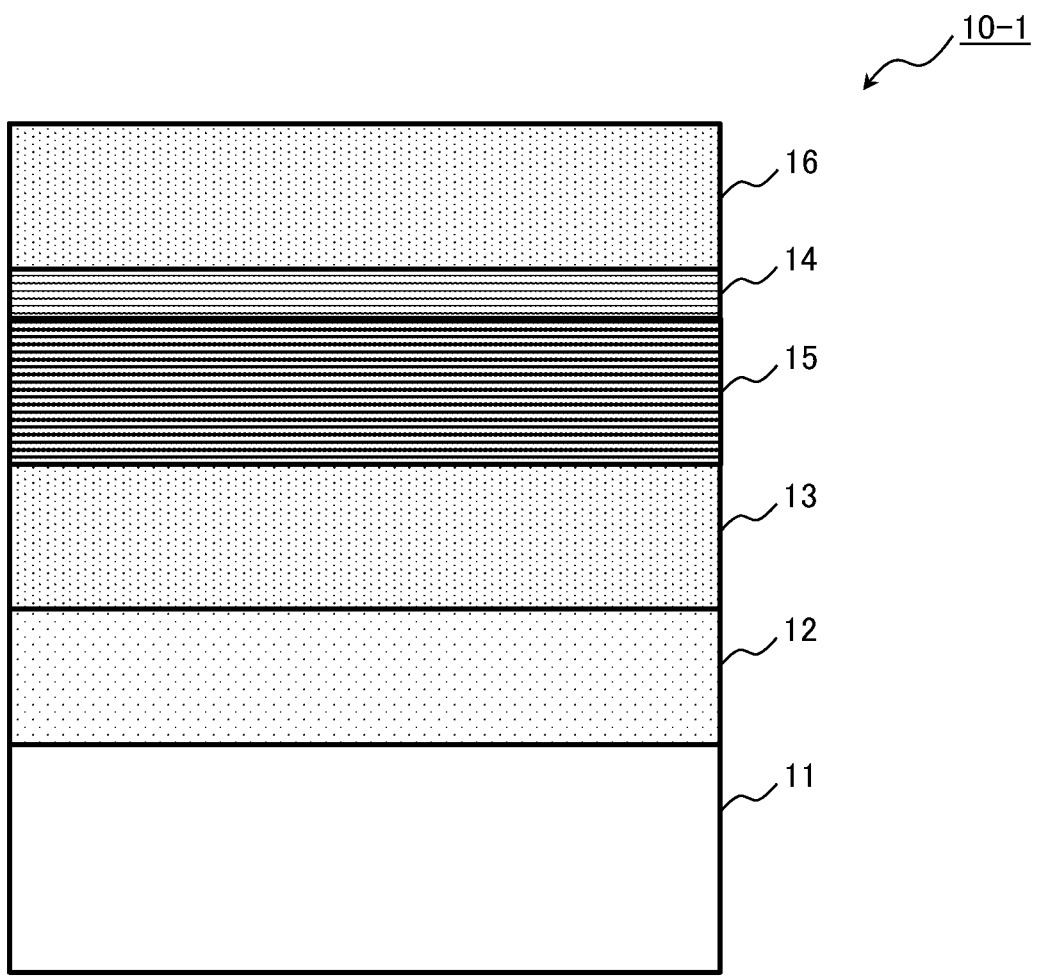
FIG. 4 is a conceptual diagram illustrating an example of the structure of a photodetection element according to a modified example of the first example embodiment of the present invention.

Next, a modified example of the photodetection element 10 according to the present example embodiment will be described with reference to the drawing. FIG. 4 is a schematic diagram illustrating an example of the structure of a photodetection element 10-1 according to the present modified example. As illustrated in FIG. 4, the photodetection element 10-1 has a structure in which a light-receiving layer 15 is sandwiched between a first contact layer 13 and an electron barrier layer 14. Except for this point, the photodetection element 10-1 is identical in configuration to the photodetection element 10 in FIG. 1.

That is, in the structure in which the light-receiving layer 15 is sandwiched between two n-type contact layers as in the present example embodiment, it does not matter in what order the electron barrier layer 14 and the light-receiving layer 15 located between the two n-type contact layers are stacked.

[Manufacturing Method]

Figure 5:
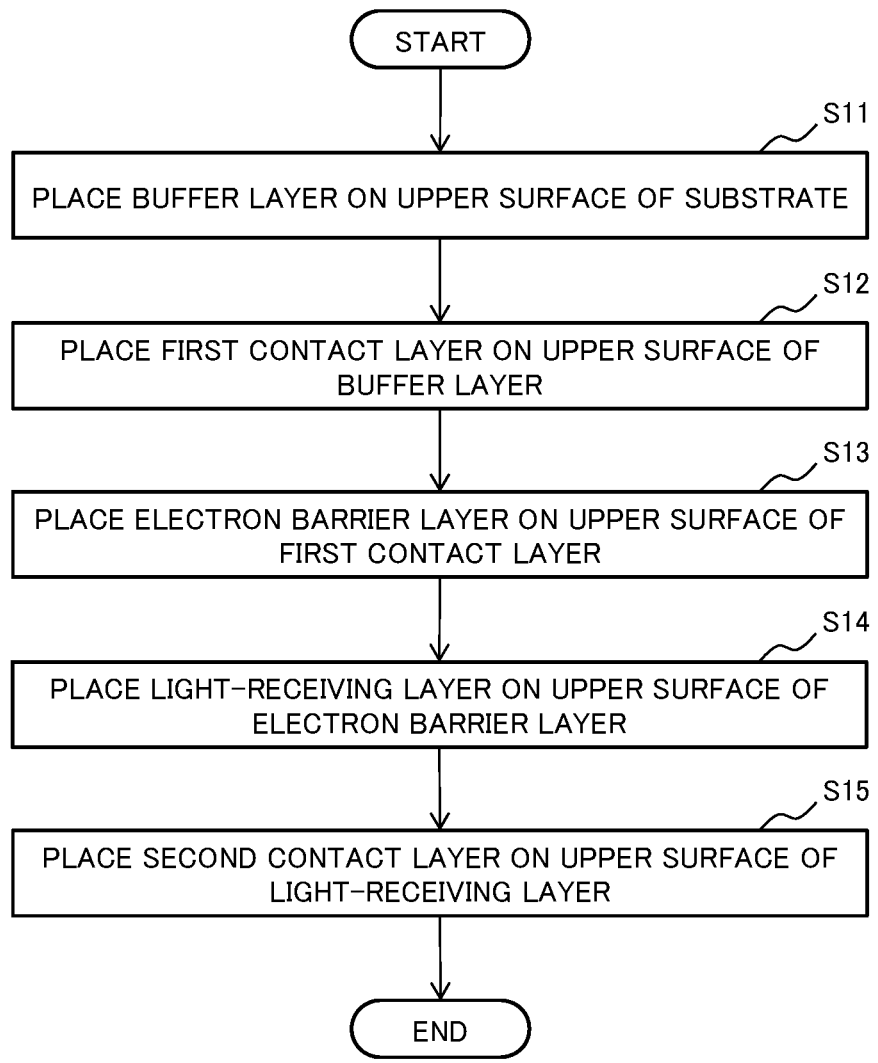
FIG. 5 is a flowchart for describing a method of manufacturing the photodetection element according to the first example embodiment of the present invention.

Next, a method of manufacturing the photodetection element 10 will be described with reference to the drawing. FIG. 5 is a flowchart for describing the method of manufacturing the photodetection element 10.

First, in FIG. 5, the buffer layer 12 (InP) with a thickness of about 500 nm is placed on the upper surface of the substrate 11 (InP) (step S11).

Next, the first contact layer 13 (n-type) with a thickness of about 500 to 1,000 nm is placed on the upper surface of the buffer layer 12 (InP) (step S12). The first contact layer 13 may contain InP as with the buffer layer 12, or may contain another semiconductor material (InGaAs or the like) lattice-matched to InP. It is possible to use Si or the like as the n-type dopant for the first contact layer 13.

Next, the electron barrier layer 14 of the type-I superlattice structure formed of several dozen AlAsSb/GaAsSb pairs (several hundred nanometers) is placed on the upper surface of the first contact layer 13 (step S13). The stacking of the AlAsSb/GaAsSb pairs may be started with the first barrier layer (AlAsSb), or may be started with the second barrier layer (GaAsSb) as long as the uppermost layer of the electron barrier layer 14 is the second barrier layer (GaAsSb). In other words, when the stacking of the AlAsSb/GaAsSb pairs is started with the second barrier layer (GaAsSb), the second barrier layer (GaAsSb) is added as the uppermost layer.

Next, the light-receiving layer 15 of the type-II superlattice structure formed of several hundred InGaAs/GaAsSb pairs (1 to 3 micrometers) is placed on the upper surface of the electron barrier layer 14 (step S14). Since the uppermost layer of the electron barrier layer 14 is the second barrier layer (GaAsSb), the stacking of layers for the light-receiving layer 15 is started with the first light-receiving layer (InGaAs). The uppermost layer of the light-receiving layer 15 may be the second light-receiving layer (GaAsSb) of the last pair. Alternatively, the first light-receiving layer (InGaAs) may be added as the uppermost layer of the light-receiving layer 15.

Then, the second contact layer 16 (n-type) with a thickness of about 500 to 1,000 nm is placed on the upper surface of the light-receiving layer 15 (step S15). The second contact layer 16 may contain InP as with the first contact layer 13, or may contain another semiconductor material (InGaAs or the like) lattice-matched to InP.

The method of manufacturing the photodetection element 10 according to the present example embodiment has been described above. The method of manufacturing the photodetection element 10 in accordance with the flowchart of FIG. 5 is an example, and the method of manufacturing the photodetection element 10 of the present example embodiment is not limited thereto.

[Infrared Detecting Element]

Next, an infrared detecting element to be manufactured as a result of processing the photodetection element 10 of the present example embodiment will be described with reference to the drawings.

Figure 6:
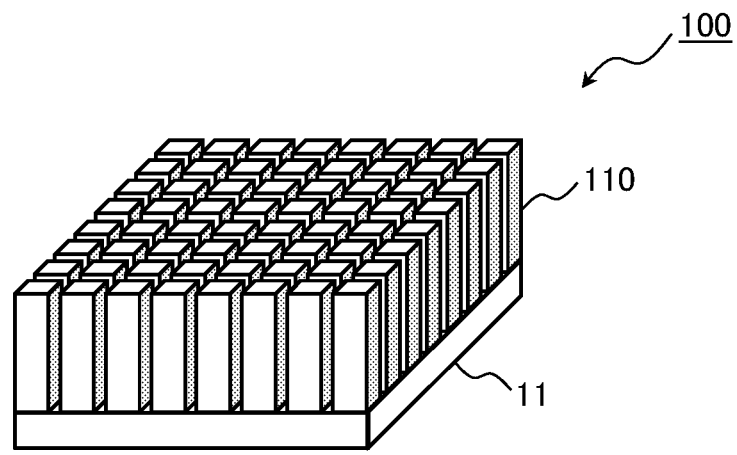
FIG. 6 is a conceptual diagram illustrating an example of forming, in an array, the light-receiving layer of the photodetection element according to the first example embodiment of the present invention.

FIG. 6 is a schematic diagram illustrating an example of an infrared detecting element 100 with an infrared detecting structure formed on the upper surface of the substrate 11, the infrared detecting structure being processed into a plurality of mesa structures 110 (also referred to as detection units). An upper electrode formed on the uppermost surface of the second contact layer is located at the uppermost end of the mesa structure 110.

The mesa structure 110 can be formed by use of a microfabrication process such as photolithography and wet etching. It is possible to manufacture the infrared detecting element 100 having detection units arranged in an array, by creating an electrode structure on the upper end of the mesa structure 110 by means of metal vapor deposition and annealing.

Figure 7:
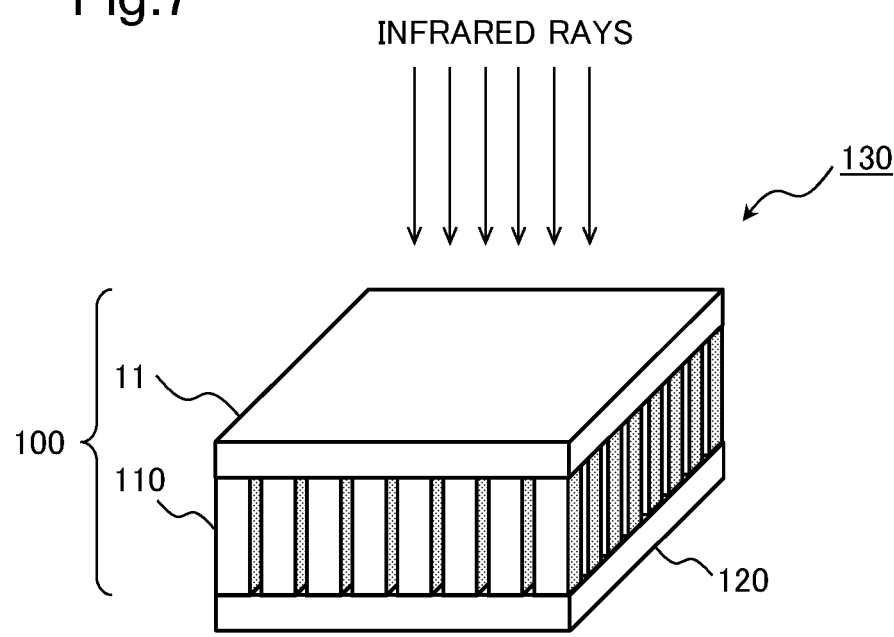
FIG. 7 is a conceptual diagram for describing an example of flip-chip bonding the photodetection element and a read-out circuit according to the first example embodiment of the present invention.

FIG. 7 is a schematic diagram illustrating an example of an infrared sensor array 130 formed by the flip-chip bonding of the infrared detecting element 100 to a readout circuit 120. The infrared sensor array 130 can be manufactured by the flip-chip bonding of the infrared detecting element 100 and the readout circuit formed on a silicon substrate.

For example, a process of producing the infrared sensor array 130 is disclosed in NPL 3.

(NPL 3: H. S. Kim et al., "Mid-IR focal plane array based on type-II strain layer superlattice detector with nBn design", Applied Physics Letters, vol. 92, 183502, 2008)

In order to cause the infrared detecting element 100 to operate, a bias voltage is applied between a lower electrode (not illustrated) formed on the first contact layer 13 and an upper electrode (not illustrated) formed on the second contact layer 16. More specifically, the voltage is applied in such a way that the lower electrode side (first contact layer 13 side) is negatively biased. When infrared rays are incident on the back surface of the substrate 11, electrons and holes are generated in the light-receiving layer 15. Since the bias voltage is applied between the first contact layer 13 and the second contact layer 16, electrons are conducted to the upper electrode side (second contact layer 16 side), and holes are conducted to the lower electrode side (first contact layer 13 side).

As described above, the photodetection element according to the present example embodiment includes: a substrate with a high infrared transmittance in a desired wavelength region; an electron barrier layer of a type-I superlattice structure, the electron barrier layer being formed above the substrate and lattice-matched to the substrate; and a light-receiving layer of a type-II superlattice structure, formed in contact with the electron barrier layer. For example, in the present example embodiment, an InP substrate is used as the substrate with a high infrared transmittance in a desired wavelength region.

Therefore, according to the photodetection element of the present example embodiment, the electron barrier layer located between the contact layer on the substrate side and the light-receiving layer prevents drift current and diffusion current, and it is thus possible to reduce dark current flowing with no relation to carriers generated by infrared rays.

In the photodetection element of the present example embodiment, the ground-state energy of the hole miniband of the electron barrier layer is substantially equal to the ground-state energy of the hole miniband of the light-receiving layer, so that conduction of holes to the lower electrode side is not prevented. Therefore, according to the photodetection element of the present example embodiment, it is not necessary to excessively apply an operation bias voltage.

For example, in the present example embodiment, the electron barrier layer includes a first barrier layer and a second barrier layer, and the thickness of the second barrier layer is adjusted in such a way that the ground-state energy of the hole miniband of the electron barrier layer matches that of the light-receiving layer.

For example, in the present example embodiment, the first barrier layer is made of AlAsSb, and the second barrier layer is made of GaAsSb. If the first barrier layer (AlAsSb) and the second barrier layer (GaAsSb) forming the electron barrier layer are equal in As rate, it is not necessary to change the flux of As and Sb when switching layers to be grown between the first barrier layer and the second barrier layer. For example, when an electron barrier layer is grown by MBE, it takes a reasonable amount of time to change the temperature of a material cell so as to change the flux. Therefore, in the present example embodiment, if the first barrier layer (AlAsSb) and the second barrier layer (GaAsSb) are made equal in As rate, there is no need to change the temperature of As and Sb cells during the growth of the electron barrier layer, so that the growth time of the electron barrier layer can be reduced.

For example, the light-receiving layer includes a first light-receiving layer and a second light-receiving layer. For example, the first light-receiving layer is made of InGaAs, and the second light-receiving layer is made of GaAsSb. If the second barrier layer (GaAsSb) of the electron barrier layer and the second light-receiving layer (GaAsSb) of the light-receiving layer are made equal in As rate, a common GaAsSb layer can be used as the endmost GaAsSb layer of the electron barrier layer and as the endmost GaAsSb layer of the light-receiving layer. Using a common layer as the endmost layer of the electron barrier layer and as the endmost layer of the light-receiving layer increases the continuity of the ground-state energy and wave function of the hole miniband at the boundary between the electron barrier layer and the light-receiving layer. Therefore, the conductivity of holes can be kept at a high level, and it is thus possible to further enhance the effect of eliminating the need for applying an excessive operation bias.

As described above, according to the photodetection element of the present example embodiment, it is possible to reduce dark current caused by dislocations due to lattice mismatch that may occur when the electron barrier layer including the type-I superlattice is formed on the substrate with a high infrared transmittance in a desired wavelength region. That is, according to the present example embodiment, it is possible to provide a photodetection element that has a high sensitivity to infrared rays in a desired wavelength region and achieves a reduction in dark current.

Second Example Embodiment

Next, a photodetection element according to a second example embodiment of the present invention will be described with reference to the drawings. The photodetection element of the present example embodiment is different from that of the first example embodiment in that one of two contact layers contains a p-type dopant. Description of the same configuration and functions as those of the photodetection element 10 according to the first example embodiment may be omitted below.

Figure 8:
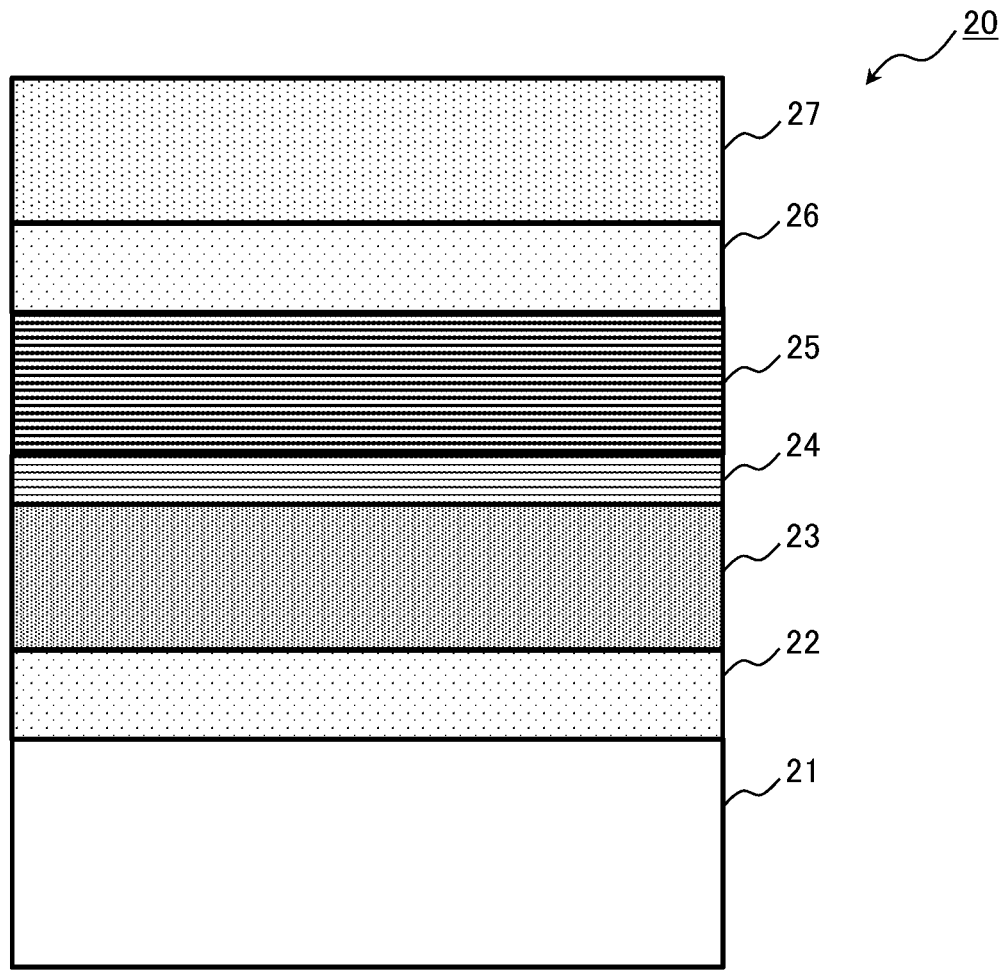
FIG. 8 is a conceptual diagram illustrating an example of the structure of a photodetection element according to a second example embodiment of the present invention.

FIG. 8 is a schematic diagram illustrating an example of the configuration of a photodetection element 20 according to the present example embodiment. As illustrated in FIG. 8, the photodetection element 20 includes a substrate 21, a first buffer layer 22, a first contact layer 23, an electron barrier layer 24, a light-receiving layer 25, a second buffer layer 26, and a second contact layer 27. The photodetection element 20 has a structure (pin type) in which the electron barrier layer 24 and the light-receiving layer 25 are sandwiched between the first contact layer 23 of p-type and the second contact layer 27 of n-type. FIG. 8 conceptually illustrates the configuration of the photodetection element 20, and does not precisely represent measurements of each layer.

The substrate 21 is a substrate with a high transmittance of desired infrared rays. The substrate 21 is the same as the substrate 11 of the first example embodiment.

The first buffer layer 22 is formed on the upper surface of the substrate 21. The first buffer layer 22 is the same as the buffer layer 12 of the first example embodiment.

The first contact layer 23 is formed on the upper surface of the first buffer layer 22. The first contact layer 23 contains a p-type dopant. For example, beryllium (Be) or zinc (Zn) can be used as the p-type dopant for the first contact layer 23. The first contact layer 23 may be identical in composition (InP) to the first buffer layer 22, or may contain another semiconductor material lattice-matched to InP. For example, instead of InP, InGaAs or the like lattice-matched to InP can be used as the first contact layer 23. It is also possible to adopt a configuration in which the first contact layer 23 is of n-type and the second contact layer 27 is of p-type.

The electron barrier layer 24 is placed on the upper surface of the first contact layer 23. The electron barrier layer 24 has a type-I superlattice structure. The electron barrier layer 24 is the same as the electron barrier layer 14 of the first example embodiment.

The light-receiving layer 25 is placed on the upper surface of the electron barrier layer 24. The light-receiving layer 25 has a type-II superlattice structure. The light-receiving layer 25 is the same as the light-receiving layer 15 of the first example embodiment.

The second buffer layer 26 is placed on the upper surface of the light-receiving layer 25. The second buffer layer 26 can be configured in the same way as the buffer layer 12 of the first example embodiment. A barrier layer (also referred to as a hole barrier layer) against conduction of holes may be provided at the position of the second buffer layer 26. A structure including the hole barrier layer is called a pBiBn structure (see NPL 4).

(NPL 4: N. Gautam et al., "Performance improvement of longwave infrared photodetector based on type-II InAs/GaSb superlattices using unipolar current blocking layers", Applied Physics Letters, vol. 96, 231107, 2010)

The second contact layer 27 is placed on the upper surface of the second buffer layer 26. The second contact layer 27 contains an n-type dopant. The second contact layer 27 is the same as the second contact layer 16 of the first example embodiment. It is also possible to adopt a configuration in which the second contact layer 27 contains a p-type dopant and the first contact layer 23 contains an n-type dopant.

In the structure (nin structure) of the photodetection element 10 of the first example embodiment, the electron barrier layer 14 may be disposed either between the first contact layer 13 and the light-receiving layer 15 or between the second contact layer 16 and the light-receiving layer 15. Meanwhile, in the structure (pin or nip structure) of the photodetection element 20 of the present example embodiment, the electron barrier layer 24 is disposed between the first contact layer 23 of p-type and the light-receiving layer 25. In the photodetection element 20 of the present example embodiment, when the first contact layer 23 is of n-type and the second contact layer 27 is of p-type, the electron barrier layer 24 is disposed between the second contact layer 27 of p-type and the light-receiving layer 25.

Figure 9:
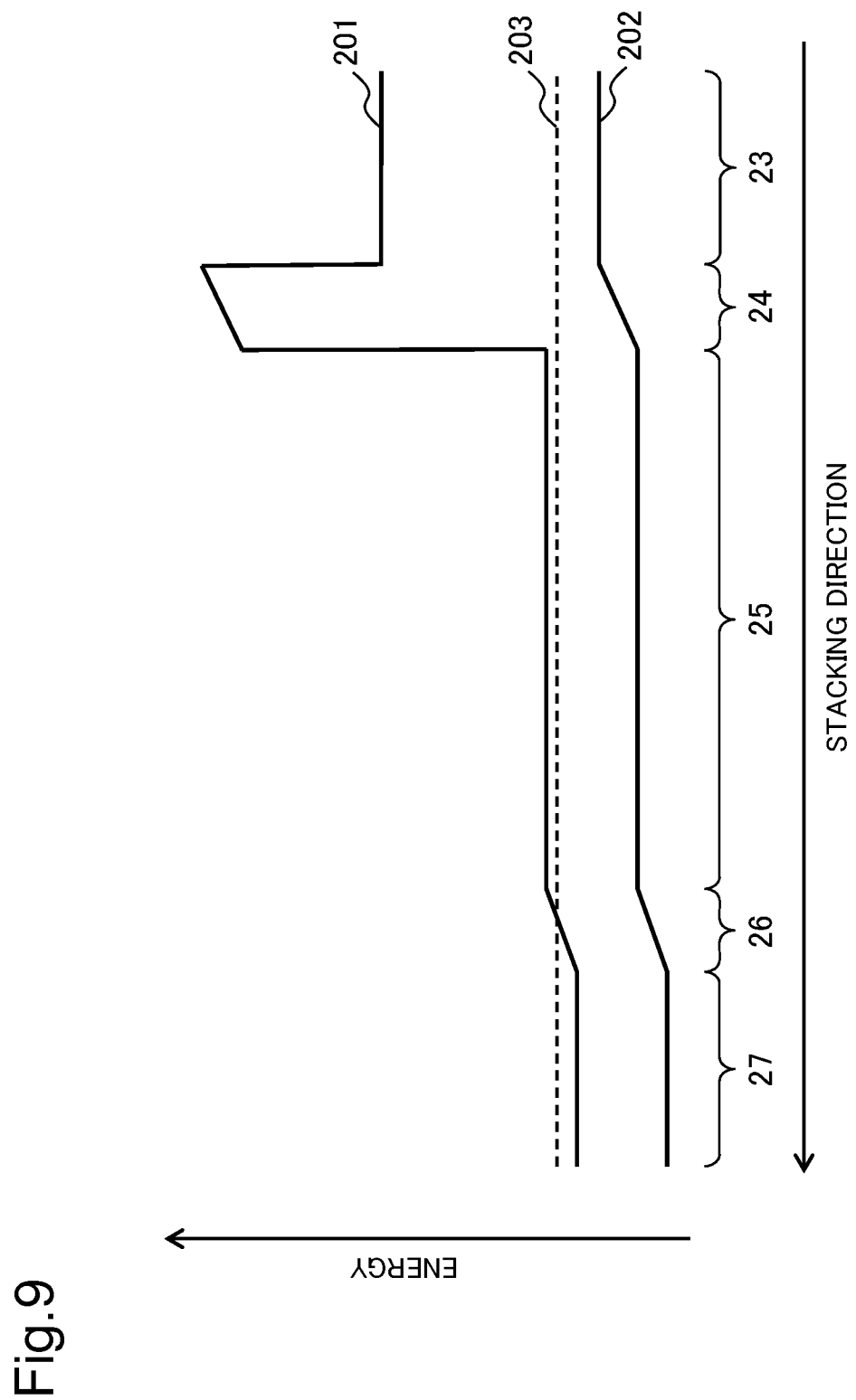
FIG. 9 is a conceptual diagram for describing the conduction band edge and valence band edge of the photodetection element according to the second example embodiment of the present invention.

FIG. 9 is a conceptual diagram depicting a conduction band edge and a valence band in a bulk semiconductor in such a way that the conduction band edge and the valence band are connected to an electron miniband and a hole miniband in a superlattice structure, respectively. In FIG. 9, the horizontal axis indicates the stacking direction, and the vertical axis indicates energy. FIG. 9 illustrates a structure in which the first contact layer 23, the electron barrier layer 24, the light-receiving layer 25, the second buffer layer 26, and the second contact layer 27 are stacked from right to left in the drawing.

In FIG. 9, an upper solid line (201) indicates the conduction band edge in the bulk semiconductor and the electron miniband in the superlattice structure, and a lower solid line (202) indicates the valence band edge in the bulk semiconductor and the hole miniband in the superlattice structure. In FIG. 9, a broken line (203) indicates the Fermi energy. It can be seen from FIG. 9 at a glance that the electron barrier layer 24 acts as a barrier to electron conduction, and does not act as a barrier to hole conduction.

As described above, the photodetection element according to the present example embodiment has a pin structure in which the electron barrier layer of the type-I superlattice structure is sandwiched between the p-type contact layer and the light-receiving layer. According to the present example embodiment, it is possible to provide a photodetection element that has a high sensitivity to infrared rays in a desired wavelength region and achieves a reduction in dark current, as in the first example embodiment.

Third Example Embodiment

Next, a photodetection element 30 according to a third example embodiment of the present invention will be described with reference to the drawing. The photodetection element 30 of the present example embodiment has a configuration as a generic concept of the photodetection element 10 of the first example embodiment and the photodetection element 20 of the second example embodiment.

Figure 10:
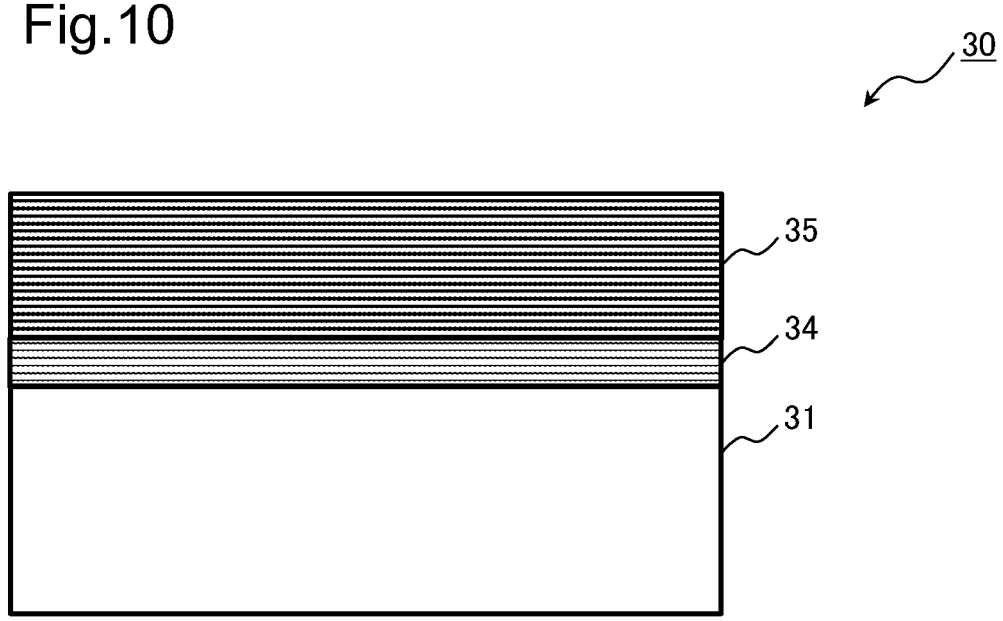
FIG. 10 is a conceptual diagram illustrating an example of the structure of a photodetection element according to a third example embodiment of the present invention.

FIG. 10 is a conceptual diagram illustrating an example of the configuration of the photodetection element 30 of the present example embodiment. As illustrated in FIG. 10, the photodetection element 30 includes a substrate 31, an electron barrier layer 34, and a light-receiving layer 35.

The substrate 31 is a substrate with a high transmittance of desired infrared rays. The substrate 31 is the same as the substrate 11 of the first example embodiment.

The electron barrier layer 34 is formed on the substrate 31. The electron barrier layer 34 has a type-I superlattice structure, and is lattice-matched to the substrate 31. The electron barrier layer 34 is the same as the electron barrier layer 14 of the first example embodiment.

The light-receiving layer 35 is formed in contact with the electron barrier layer 34. For example, the light-receiving layer 35 has a type-II superlattice structure. The light-receiving layer 35 is the same as the light-receiving layer 15 of the first example embodiment. The light-receiving layer 35 may be formed of a bulk semiconductor.

For example, when the light-receiving layer 35 has the type-II superlattice structure, the ground state of the hole miniband of the electron barrier layer 34 substantially coincides with the ground state of the hole miniband of the light-receiving layer 35. When the light-receiving layer 35 is a bulk semiconductor, the hole miniband of the electron barrier layer 34 substantially coincides with the valence band edge of the light-receiving layer 35.

For example, the substrate 31 is an InP substrate. For example, at least one of the electron barrier layer 34 and the light-receiving layer 35 contains P.

For example, the electron barrier layer 34 includes a first barrier layer and a second barrier layer. For example, the thickness of the second barrier layer is adjusted in such a way that the ground-state energy of the hole miniband of the barrier layer matches that of the light-receiving layer 35. For example, in the electron barrier layer 34, the first barrier layer is made of AlAsSb and the second barrier layer is made of GaAsSb. For example, the first barrier layer and the second barrier layer are equal in ratio of As and Sb. For example, the rates of As among group V elements contained in the first barrier layer and the second barrier layer are each 0.55. Elements belonging to group 15 of the periodic table of elements are generically called group V elements. For example, As, Sb, P, and the like are typical group V elements.

For example, the light-receiving layer 35 includes a first light-receiving layer and a second light-receiving layer. For example, the first light-receiving layer is made of InGaAs, and the second light-receiving layer is made of GaAsSb. For example, the second barrier layer included in the electron barrier layer and the second light-receiving layer included in the light-receiving layer are equal in ratio of As and Sb. For example, a common layer is used as the second barrier layer of the electron barrier layer and as the second light-receiving layer of the light-receiving layer at the boundary between the electron barrier layer and the light-receiving layer. For example, the rate of In among group III elements contained in the first light-receiving layer is 0.52, and the rate of As among the group V elements contained in the second light-receiving layer is 0.55. Elements belonging to group 13 of the periodic table of elements are generically called group III elements. For example, Al, In, Ga, and the like are typical group V elements.

According to the present example embodiment, it is possible to provide a photodetection element that has a high sensitivity to infrared rays in a desired wavelength region and achieves a reduction in dark current, as in the first and second example embodiments.

Fourth Example Embodiment

Next, an infrared detecting apparatus (also referred to as an infrared camera) according to a fourth example embodiment of the present invention will be described with reference to the drawing. The infrared detecting apparatus of the present example embodiment includes any of the photodetection elements of the first to third example embodiments.

Figure 11:
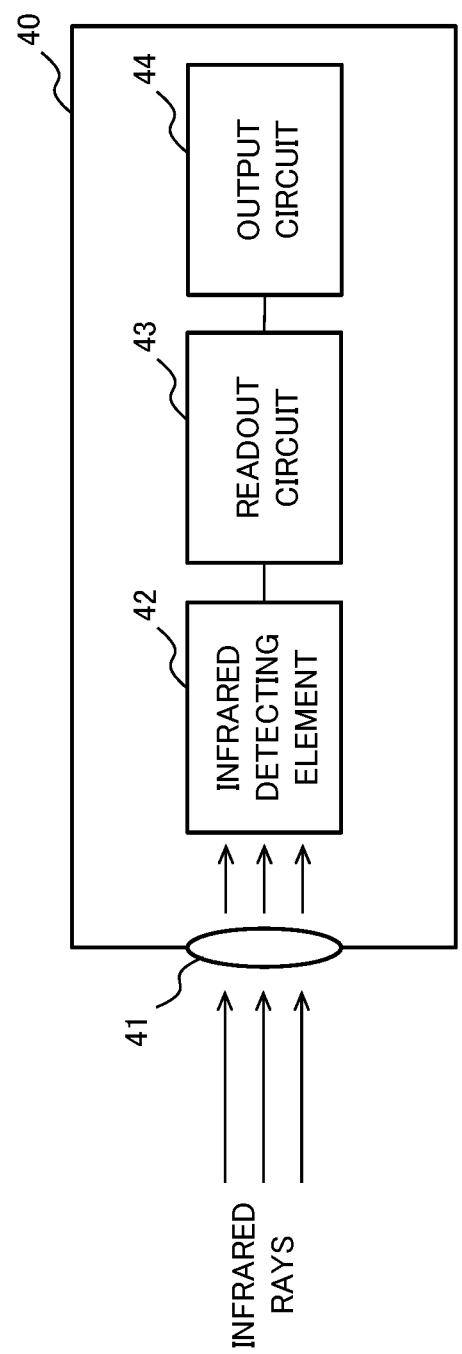
FIG. 11 is a conceptual diagram illustrating an example of the configuration of an infrared detecting apparatus according to a fourth example embodiment of the present invention.

FIG. 11 is a conceptual diagram illustrating an example of the configuration of an infrared detecting apparatus 40 according to the present example embodiment. As illustrated in FIG. 11, the infrared detecting apparatus 40 includes an infrared optical system 41, an infrared detecting element 42, a readout circuit 43, and an output circuit 44.

The infrared optical system 41 (also referred to as an infrared-light optical system) includes a lens that focuses infrared light onto a light-receiving unit of the infrared detecting element 42. The infrared optical system 41 includes at least one lens. The lens of the infrared optical system 41 is made of a material that has a high transmittance of infrared light and refracts infrared light on the light-receiving surface of the infrared detecting element 42. For example, germanium, silicon, zinc sulfide, zinc selenide, and chalcogenide glass can be applied to the material of the lens of the infrared optical system 41. The lens of the infrared optical system 41 just needs to be selected according to the wavelength of infrared light to be detected. The infrared optical system 41 may include a filter that blocks or transmits light in a specific wavelength region. The infrared optical system 41 may include a reflecting mirror for guiding infrared light to the light-receiving unit of the infrared detecting element 42, and a diaphragm for controlling the amount of infrared light.

The infrared detecting element 42 has an infrared light detection structure formed of any of the photodetection elements of the first to third example embodiments fabricated in an array. In other words, the infrared detecting element 42 has a structure in which detection units obtained by the stacking of a light-receiving layer of a type-II superlattice structure and an electron barrier layer of a type-I superlattice structure are arranged in an array on a substrate with a high transmittance for desired infrared rays. Each of a plurality of the detection units forming the infrared light detection structure of the infrared detecting element 42, fabricated in an array, independently detects infrared rays. Each of the plurality of detection units forming the infrared light detection structure of the infrared detecting element 42, fabricated in an array, corresponds to a pixel of an infrared image.

The readout circuit 43 is connected to the infrared detecting element 42. For example, the readout circuit 43 is flip-chip bonded to the infrared detecting element 42 as illustrated in FIG. 7. The infrared detecting element 42 and the readout circuit 43 form an infrared sensor array. The readout circuit 43 reads electrical signal of infrared rays detected by the infrared detecting element 42 for each detection unit (pixel) of the infrared detecting element 42.

The output circuit 44 outputs a signal based on the infrared light detected by the readout circuit 43. For example, the output circuit 44 outputs the signal based on the infrared light detected by the readout circuit 43 to an external system. For example, the output circuit 44 may generate an infrared image from the signal based on the infrared light detected by the readout circuit 43 and cause the generated infrared image to be displayed on a monitor installed in the own apparatus.

The infrared detecting apparatus 40 may include a cooling device that cools the infrared detecting element 42. For example, a Peltier element or the like can be used as the cooling device that cools the infrared detecting element 42. If the infrared detecting element 42 is cooled to a low temperature, thermal noise can be reduced and sensitivity is thus improved. If the infrared detecting element 42 is cooled to a low temperature, the speed of response to infrared light can be maintained at a specific level.

As described above, according to the present example embodiment, it is possible to provide an infrared camera equipped with a photodetection element that has a high sensitivity to infrared rays in a desired wavelength region and achieves a reduction in dark current.

While the present invention has been particularly shown and described with reference to example embodiments thereof, the present invention is not limited to these example embodiments. It will be understood by those of ordinary skill in the art that various changes in form and details may be made therein without departing from the spirit and scope of the present invention as defined by the claims.

Some or all of the above example embodiments may also be described as set forth in the following supplementary notes, but are not limited thereto.

(Supplementary Note 1)
A photodetection element including:
a substrate with a high infrared transmittance in a desired wavelength region;
an electron barrier layer of a type-I superlattice structure, the electron barrier layer being formed above the substrate and lattice-matched to the substrate; and
a light-receiving layer of a type-II superlattice structure, formed in contact with the electron barrier layer.

(Supplementary Note 2)
The photodetection element according to supplementary note 1, wherein ground-state energy of a hole miniband of the electron barrier layer is substantially equal to ground-state energy of a hole miniband of the light-receiving layer.

(Supplementary Note 3)
The photodetection element according to supplementary note 1 or 2, wherein the substrate is an InP substrate.

(Supplementary Note 4)
The photodetection element according to any one of supplementary notes 1 to 3, wherein
the electron barrier layer includes a first barrier layer and a second barrier layer, and a thickness of the second barrier layer is adjusted in such a way that the ground-state energy of the hole miniband of the electron barrier layer matches the ground-state energy of the hole miniband of the light-receiving layer.

(Supplementary Note 5)

The photodetection element according to supplementary note 4, wherein the first barrier layer is made of AlAsSb, and the second barrier layer is made of GaAsSb in the electron barrier layer.

(Supplementary Note 6)

The photodetection element according to supplementary note 5, wherein
the light-receiving layer includes a first light-receiving layer and a second light-receiving layer, and
the first light-receiving layer is made of InGaAs, and the second light-receiving layer is made of GaAsSb.

(Supplementary Note 7)

The photodetection element according to supplementary note 6, wherein ratios of As and Sb in the first barrier layer and the second barrier layer are equal.

(Supplementary Note 8)

The photodetection element according to supplementary note 6 or 7, wherein ratios of As and Sb in the second barrier layer included in the electron barrier layer and the second light-receiving layer included in the light-receiving layer are equal.

(Supplementary Note 9)

The photodetection element according to supplementary note 8, wherein a common layer is used as the second barrier layer of the electron barrier layer and as the second light-receiving layer of the light-receiving layer at a boundary between the electron barrier layer and the light-receiving layer.

(Supplementary Note 10)

The photodetection element according to any one of supplementary notes 6 to 9, wherein rates of As among group V elements contained in the first barrier layer and the second barrier layer are each 0.55.

(Supplementary Note 11)

The photodetection element according to any one of supplementary notes 6 to 10, wherein
a rate of In among group III elements contained in the first light-receiving layer is 0.52, and
a rate of As among group V elements contained in the second light-receiving layer is 0.55.

(Supplementary Note 12)

The photodetection element according to any one of supplementary notes 6 to 11, wherein at least one of the electron barrier layer and the light-receiving layer contains P.

(Supplementary Note 13)

The photodetection element according to any one of supplementary notes 1 to 12, further including:
two contact layers sandwiching the electron barrier layer and the light-receiving layer.

(Supplementary Note 14)

The photodetection element according to supplementary note 13, wherein both of the two contact layers contain an n-type dopant.

(Supplementary Note 15)

The photodetection element according to supplementary note 13, wherein
one of the two contact layers contains a p-type dopant, another of the two contact layers contains an n-type dopant, and
the electron barrier layer is disposed between the contact layer containing the p-type dopant and the light-receiving layer.

(Supplementary Note 16)

The photodetection element according to any one of supplementary notes 13 to 15, further including:
a buffer layer disposed between at least one of the two contact layers and the substrate, the buffer layer being made of a same material as the substrate and lattice-matched to the substrate.

(Supplementary Note 17)

The photodetection element according to supplementary note 15 or 16, wherein a hole barrier layer is disposed between the light-receiving layer and the contact layer.

(Supplementary Note 18)

The photodetection element according to any one of supplementary notes 1 to 17, wherein a degree of mismatch between lattice constants of the electron barrier layer and the substrate is less than 1%.

(Supplementary Note 19)

The photodetection element according to any one of supplementary notes 1 to 18, further including:
an infrared detecting structure in which detection units each including at least the electron barrier layer and the light-receiving layer are arranged in an array on the substrate.

(Supplementary Note 20)

An infrared detecting apparatus including:
the photodetection element according to supplementary note 19;
a readout circuit that reads electrical signal of infrared rays detected by the photodetection element for each of the detection units, the readout circuit being flip-chip bonded to the photodetection element;
an infrared optical system that focuses infrared light on the infrared detecting structure of the photodetection element; and
an output circuit that outputs a signal based on infrared light detected for each of the detection units.

REFERENCE SIGNS LIST 10, 20, 30 photodetection element
11, 21, 31 substrate
12 buffer layer
13, 23 first contact layer
14, 24, 34 electron barrier layer
15, 25, 35 light-receiving layer
16, 27 second contact layer
22 first buffer layer
26 second buffer layer
40 infrared detecting apparatus
41 infrared optical system
42 infrared detecting element
43 readout circuit
44 output circuit

What is claimed is:
1. A photodetection element comprising:
a substrate;
an electron barrier layer of a type-I superlattice structure, the electron barrier layer being formed above the substrate and lattice-matched to the substrate;
a light-receiving layer of a type-II superlattice structure, formed in contact with the electron barrier layer; and
two contact layers sandwiching the electron barrier layer and the light-receiving layer, wherein the substrate is an InP substrate, one of the two contact layers contains a p-type dopant, another of the two contact layers contains an n-type dopant, and the electron barrier layer is disposed between the one of the two contact layers containing the p-type dopant and the light-receiving layer.

2. The photodetection element according to claim 1, wherein ground-state energy of a hole miniband of the electron barrier layer is substantially equal to ground-state energy of a hole miniband of the light-receiving layer.

3. The photodetection element according to claim 1, wherein the electron barrier layer includes a first barrier layer and a second barrier layer, and a thickness of the second barrier layer is adjusted in such a way that ground-state energy of a hole miniband of the electron barrier layer matches ground-state energy of a hole miniband of the light-receiving layer.

4. The photodetection element according to claim 3, wherein the first barrier layer is made of AlAsSb, and the second barrier layer is made of GaAsSb in the electron barrier layer.

5. The photodetection element according to claim 4, wherein the light-receiving layer includes a first light-receiving layer and a second light-receiving layer, and the first light-receiving layer is made of InGaAs, and the second light-receiving layer is made of GaAsSb.

6. The photodetection element according to claim 5, wherein ratios of As and Sb in the first barrier layer and the second barrier layer are equal.

7. The photodetection element according to claim 5, wherein ratios of As and Sb in the second barrier layer included in the electron barrier layer and the second light-receiving layer included in the light-receiving layer are equal.

8. The photodetection element according to claim 7, wherein a common layer is used as the second barrier layer of the electron barrier layer and as the second light-receiving layer of the light-receiving layer at a boundary between the electron barrier layer and the light-receiving layer.

9. The photodetection element according to claim 5, wherein rates of As among group V elements contained in the first barrier layer and the second barrier layer are each 0.55.

10. The photodetection element according to claim 5, wherein a rate of In among group III elements contained in the first light-receiving layer is 0.52, and a rate of As among group V elements contained in the second light-receiving layer is 0. 55.

11. The photodetection element according to claim 5, wherein at least one of the electron barrier layer and the light-receiving layer contains P.

12. The photodetection element according to claim 1, wherein both of the two contact layers contain the n-type dopant.

13. The photodetection element according to claim 1, further comprising:

a buffer layer disposed between at least one of the two contact layers and the substrate, the buffer layer being made of a same material as the substrate and lattice-matched to the substrate.

14. The photodetection element according to claim 1, wherein a hole barrier layer is disposed between the light-receiving layer and the one of the two contact layers containing the p-type dopant.

15. The photodetection element according to claim 1, wherein a degree of mismatch between lattice constants of the electron barrier layer and the substrate is less than 1%.

16. The photodetection element according to claim 1, further comprising:

an infrared detecting structure in which detection units each including at least the electron barrier layer and the light-receiving layer are arranged in an array on the substrate.

17. An infrared detecting apparatus comprising:

the photodetection element according to claim 16;

a readout circuit that reads electrical signal of infrared rays detected by the photodetection element for each of the detection units, the readout circuit being flip-chip bonded to the photodetection element;

an infrared optical system that focuses infrared light on the infrared detecting structure of the photodetection element; and an output circuit that outputs a signal based on infrared light detected for each of the detection units.

* * * * *